(12) United States Patent
Skofljanec

(10) Patent No.: US 6,493,232 B2
(45) Date of Patent: Dec. 10, 2002

(54) HOUSING FOR AN ELECTRONIC CONTROL DEVICE IN VEHICLES

(75) Inventor: Robert Skofljanec, Moos-Bankholzen (DE)

(73) Assignee: TRW Automotive Electronics & Components GmbH & Co. KG, Radolfzell (DE)

(*) Notice: Subject to any disclaimer, the term of this patent is extended or adjusted under 35 U.S.C. 154(b) by 0 days.

(21) Appl. No.: 09/907,347

(22) Filed: Jul. 17, 2001

(65) Prior Publication Data

US 2002/0024800 A1 Feb. 28, 2002

(30) Foreign Application Priority Data

Jul. 18, 2000 (DE) ...................... 200 12 623 U

(51) Int. Cl.⁷ ................................. H05K 5/00
(52) U.S. Cl. .................. 361/752; 361/737; 439/76.1; 439/906
(58) Field of Search ................. 361/737, 752; 174/138 D, 138 G, 138 F; 439/79, 607, 76.1, 521, 367, 696, 687, 906, 97, 108

(56) References Cited

U.S. PATENT DOCUMENTS

| 4,398,780 A | * | 8/1983 | Novotny et al. | |
| 4,811,165 A | * | 3/1989 | Currier et al. | 361/368 |
| 5,358,428 A | * | 10/1994 | Bixler et al. | 439/607 |
| 5,836,774 A | * | 11/1998 | Tan et al. | 439/76.1 |
| 6,216,972 B1 | | 4/2001 | Rohrle | |
| 6,259,440 B1 | * | 6/2001 | Affolter | 361/769 |
| 6,280,205 B1 | * | 8/2001 | Murowaki et al. | 439/79 |
| 6,319,026 B1 | * | 11/2001 | Chen et al. | 439/108 |
| 6,343,953 B2 | * | 2/2002 | Nakamura et al. | 439/559 |

FOREIGN PATENT DOCUMENTS

| DE | 3310477 C2 | 3/1991 |
| DE | 4107620 A1 | 9/1992 |
| DE | 4321331 A1 | 1/1995 |
| DE | 4445125 A1 | 6/1996 |
| DE | 29918914 U1 | 4/2000 |
| EP | 0430057 A1 | 6/1991 |

* cited by examiner

Primary Examiner—David Martin
Assistant Examiner—Thanh S. Phan
(74) Attorney, Agent, or Firm—Tarolli, Sundheim, Covell, Tummino & Szabo L.L.P.

(57) ABSTRACT

A housing for an electronic control device in vehicles comprises a bottom part (10) which has a metallic baseplate (12), and a cover part (14) made of plastic. The bottom part (10) has a front wall (16) made of plastic that rises up from the baseplate and to which a plug collar (18) is integrally molded. The plug collar (18) defines an accommodation for a contact pin carrier (28) formed as a flat strip with through holes for passing contact pins (32). The contact pin carrier (28) can be inserted into the plug collar (18) from inside of the housing.

17 Claims, 2 Drawing Sheets

HOUSING FOR AN ELECTRONIC CONTROL DEVICE IN VEHICLES

TECHNICAL FIELD

The present invention relates to a housing for an electronic control device in vehicles, comprising a bottom part that has a metallic baseplate, and a cover part made of plastic.

BACKGROUND OF THE INVENTION

Housings for electronic control devices in vehicles for occupant restraint systems, which are the subject matter of German Utility Model 29 918 914, are configured as composite bodies consisting of a plastic body part made by injection molding and of a metallic baseplate that is at least partially embedded in a plastic compound. A narrow front side of the housing is left open to be closed by a plug base that is directly fixed to a printed circuit board. With such embodiments, a variation of the printed circuit board design and fittings is usually associated with changes to the plug base and/or to the pin configuration of the plug.

SUMMARY OF THE INVENTION

The present invention provides a housing for electronic control devices in which a uniform design of the housing parts and of the plug collar allows considerable flexibility in terms of the design of the printed circuit board and the number of plug contacts.

In accordance with the invention, a housing for an electronic control device in vehicles is provided wherein a bottom part has a front wall that rises up from a baseplate and has an integrally molded plug collar. A contact pin carrier that has multiple through holes and that bears contact pins inserted into the holes can be inserted into the plug collar from the inside of the housing. Thus, the configuration of the plug collar is not dependent on the number and arrangement of the contact pins, nor on the shape and arrangement of a printed circuit board to be accommodated in the housing.

BRIEF DESCRIPTION OF THE DRAWINGS

Further advantages and features of the invention ensue from the following description of several embodiments and from the drawings to which reference is made. The drawings show the following.

DETAILED DESCRIPTION OF THE PREFERRED EMBODIMENT

Figure 1:
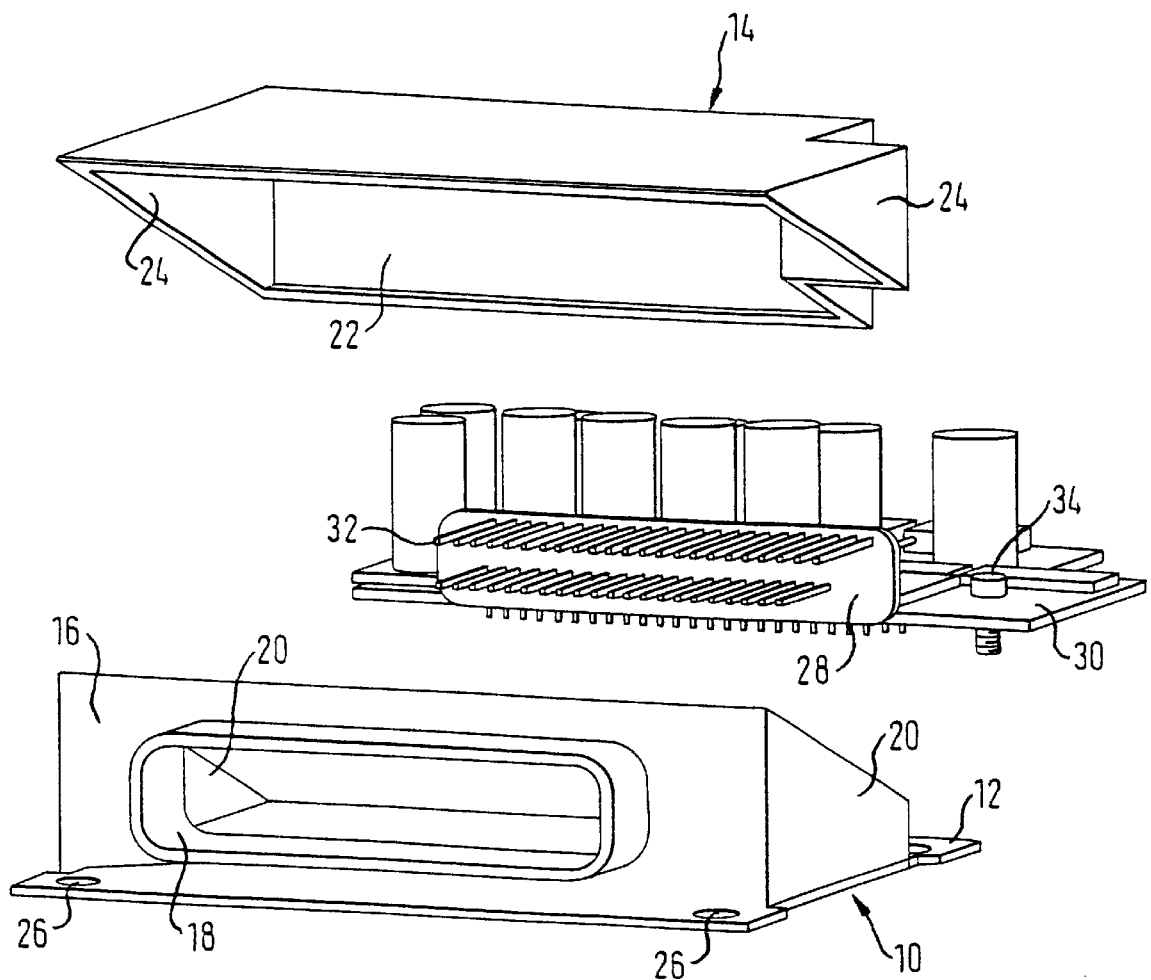
FIG. 1—a perspective view of individual Components of the control device.

The housing of the control device consists of a bottom part 10 made of plastic with an embedded metal baseplate 12 and a cover part 14 made of plastic. The bottom part 10 has a front wall 16 that rises up from the baseplate 12 and to which a plug collar 18 is integrally molded. The front wall 16 is integrally molded with two side walls 20 which, in the assembled state, slope towards a back wall 22 of the housing. The back wall 22 of the housing is molded to the cover part 14 which, in turn, has two perpendicularly adjoining side walls 24 that are complementary to the side walls 20 of the bottom part 10. The metallic baseplate 12 projects beyond the front wall 16 and one side wall 20 of the bottom part 10 and has attachment openings 26 at its corners. A strip-shaped contact pin carrier 28 can be locked in place by means of locking elements (not shown here) in the plug collar 18. The contact pin carrier 28 has a plurality of through holes into which contact pins 32 are inserted. The contact pins 32 are soldered into a printed circuit board 30. The contact pin carrier 28 is also fixed to the printed circuit board 30 via the contact pins 32.

The separate configuration of the plug collar 18 and of the contact pin carrier 28 has the advantage that the design of the printed circuit board 30 can be changed independently of the plug collar 18. Any design changes then only affect the contact pin carrier 28 whose simple design makes it possible to change the number or arrangement of the contact pins 32 without great effort and thus cost-effectively. The simple design of the contact pin carrier 28 has the advantage that it is space-saving so that an optimal utilization of the printed circuit board surface is possible.

A contact element 34 is provided to create an electric ground connection between the baseplate 12 and the printed circuit board 30. Four embodiment variants of this electrically conductive contact element 34 are shown in FIGS. 2 through 5.

Figure 2:
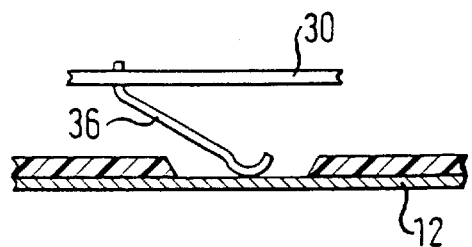
FIGS. 2 through 5—various embodiment variants of an electric ground bridge between the baseplate of the housing and a contact element fixed to the printed circuit board.

In the embodiment shown in FIG. 2, an elastic and electrically conductive contact lug 36 is soldered onto the printed circuit board 30. At its opposite end, the contact lug 36 makes contact with the metal baseplate 12 of the bottom part 10 that is maintained in that the contact lug 36 is elastically clamped between the printed circuit board 30 and the baseplate 12.

Figure 3:
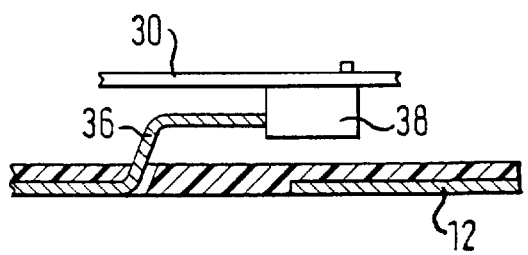

In the embodiment shown in FIG. 3, a contact lug 36 has been stamped out of the baseplate 12 and is bent upwards essentially at a right angle. The free end of the contact lug 36 opens up essentially parallel to the printed circuit board 30 into a bushing 38 that is fixed to the printed circuit board 30, for example, by a solder connection and by means of which a plug contact with the printed circuit board 30 is established.

Figure 4:
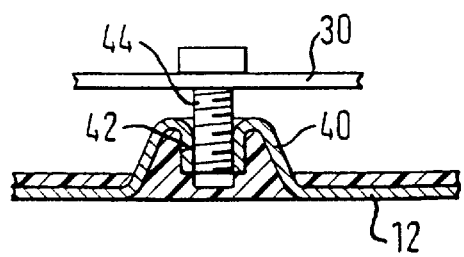

In the embodiment shown in FIG. 4, the baseplate 12 has a boss 40 with a contact borehole 42. A contact pin 44 in the form of a metal screw has been inserted through a borehole in the printed circuit board 30, in such a way that the pin's lower end in FIG. 4 is fixed to the baseplate 12 in the contact borehole 42.

Figure 5:
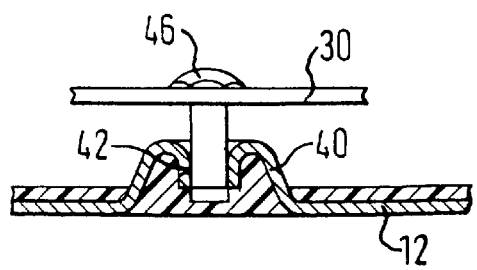

The embodiment shown in FIG. 5 corresponds to the embodiment shown in FIG. 4, except for the fact that the contact pin 44 here is configured as a contact rivet 46.

During the assembly of the control device, the contact pin carrier 28 is attached onto the printed circuit board 30 by means of the contact pins 32 and subsequently inserted into the plug collar 18 from the end that is opposite from the front wall 16 of the bottom part 10. In this process, locking elements (not shown here) cause the contact pin carrier 28 to lock or latch in the plug collar 18 and the printed circuit board 30 is mounted onto support elements (not shown here) that are molded to the bottom part 10. Then, according to one of the above-mentioned embodiment variants, an electrically conductive ground connection is made between the printed circuit board 30 and the baseplate 12. Finally, the cover part 14 is tightly welded with the bottom part 10, for example, by means of a laser welding process.

What is claimed is:

1. A housing for an electronic control device in vehicles, said housing comprising:

a bottom part made of plastic having an embedded metallic baseplate; and a cover part made of plastic, said bottom part having a front wall rising up from said baseplate and a plug collar being integrally molded with said front wall, said plug collar defining an accommodation for a contact pin carrier formed as a flat strip with through holes for passing contact pins, said contact pin carrier being adapted to be inserted into said plug collar from inside of said housing, said contact pin carrier being able to be locked in said plug collar, said contact pins being attached to a printed circuit board of the electronic control device, said printed circuit board being directly electrically connected to said baseplate by at least one contact element.

2. The housing according to claim 1 wherein said printed circuit board is mounted on support elements that are molded to said bottom part so that said printed circuit board is slightly spaced from said baseplate.

3. The housing according to claim 1 wherein said contact element is an elastic lug.

4. The housing according to claim 1 wherein said contact element is one of a group consisting of a metal screw and a rivet.

5. The housing according to claim 4 wherein said baseplate has a boss with a contact borehole into which said contact element can be inserted.

6. The housing according to claim 1 wherein said bottom part has a pair of spaced side walls sloping in a direction away from said front wall and towards said baseplate, said pair of spaced side walls being integrally molded with said front wall.

7. The housing according to claim 6 wherein said cover part has an integrally molded back wall and a pair of integrally molded side walls that is complementary to said pair of side walls of said bottom part.

8. The housing according to claim 1 wherein said cover part is tightly welded to said bottom part.

9. An apparatus comprising:

a printed circuit board for controlling an electronic device, said printed circuit board having a carrier strip and a plurality of contact pins being attached to said printed circuit board, said plurality of contact pins extending through said carrier strip; and a housing for said printed circuit board, said housing having a plastic bottom part, a plastic upper part associated with said plastic bottom part, and a metal baseplate embedded within said plastic bottom part, said plastic bottom part having a front wall projecting upward from said metal baseplate and a plug collar being integrally molded with said front wall and extending away from said front wall, said plug collar defining an opening in said front wall for receiving said carrier strip, said carrier strip being locked within said opening of said plug collar such that said plurality of contact pins are accessible from the exterior of said housing, said printed circuit board being electrically grounded to said baseplate by at least one contact element, said at least one contact element extending between said baseplate and said printed circuit board and engaging both said baseplate and said printed circuit board.

10. The apparatus as set forth in claim 9 wherein said printed circuit board controls an occupant restraint system for a vehicle.

11. The apparatus as set forth in claim 9 wherein said at least one contact element comprises a contact lug soldered to said printed circuit board such that said contact lug forms the grounded connection between said baseplate and said printed circuit board by abutting a surface of said baseplate.

12. The apparatus as set forth in claim 9 wherein said at least one contact element comprises a bushing fixed to said printed circuit board and a lug stamped out of said base plate, a free end of said lug being inserted into said bushing to form the grounded connection between said baseplate and said printed circuit board.

13. The apparatus as set forth in claim 9 wherein said at least one contact element comprises a boss projecting upward from said baseplate and a contact pin being inserted through an opening in said printed circuit board into a bore of said boss to form the grounded connection between said baseplate and said printed circuit board.

14. The apparatus as set forth in claim 13 wherein said contact pin comprises a metal screw threaded into said bore of said boss such that said printed circuit board is fixed to said baseplate.

15. The apparatus as set forth in claim 13 wherein said contact pin comprises a metal rivet inserted into said bore of said boss such that said printed circuit board is fixed to said baseplate.

16. The apparatus as set forth in claim 9 wherein said plastic bottom part of said housing further includes two side walls extending perpendicularly from said front wall, said side walls of said bottom part each having an edge sloped downward away from said front wall.

17. The apparatus as set forth in claim 16 wherein said plastic upper part further includes a rear wall and two side walls extending perpendicularly from said back wall, said side walls of said upper part each having an edge sloped upward away from said back wall.

* * * * *